United States Patent
Van Der Goes et al.

(10) Patent No.: US 9,325,313 B2
(45) Date of Patent: Apr. 26, 2016

(54) LOW-POWER LEVEL-SHIFT CIRCUIT FOR DATA-DEPENDENT SIGNALS

(71) Applicant: BROADCOM CORPORATION, Irvine, CA (US)

(72) Inventors: Franciscus Van Der Goes, The Hague (NL); Christopher Michael Ward, Utrecht (NL)

(73) Assignee: Broadcom Corporation, Irvine, CA (US)

( * ) Notice: Subject to any disclaimer, the term of this patent is extended or adjusted under 35 U.S.C. 154(b) by 130 days.

(21) Appl. No.: 14/185,853

(22) Filed: Feb. 20, 2014

(65) Prior Publication Data

US 2015/0214946 A1 Jul. 30, 2015

Related U.S. Application Data

(60) Provisional application No. 61/932,689, filed on Jan. 28, 2014.

(51) Int. Cl.
*H03L 5/00* (2006.01)
*H03K 19/00* (2006.01)
*H03K 3/356* (2006.01)
*H03K 19/0185* (2006.01)

(52) U.S. Cl.
CPC ...... *H03K 19/0013* (2013.01); *H03K 3/356121* (2013.01); *H03K 19/018521* (2013.01)

(58) Field of Classification Search
None
See application file for complete search history.

(56) References Cited

U.S. PATENT DOCUMENTS

| | | | | |
|---|---|---|---|---|
| 7,161,518 B1 * | 1/2007 | Webb | ........... | G09G 3/2011 310/309 |
| 7,212,598 B2 * | 5/2007 | Kliesner | ........... | G06F 5/06 327/152 |
| 7,292,217 B2 * | 11/2007 | Tseng | ........... | G09G 3/3688 327/333 |
| 7,388,531 B1 * | 6/2008 | Cyrusian | ........... | H03M 1/0604 326/93 |
| 7,928,950 B2 * | 4/2011 | Osame | ........... | G09G 3/20 327/333 |
| 8,674,863 B2 * | 3/2014 | Grilo | ........... | H03K 17/063 327/91 |
| 8,791,743 B1 * | 7/2014 | Tang | ........... | H03K 3/356104 326/80 |
| 8,866,652 B2 * | 10/2014 | Singer | ........... | H03M 1/1245 327/296 |
| 2002/0149557 A1 * | 10/2002 | Goetz | ........... | G09G 3/2011 345/100 |
| 2003/0076149 A1 * | 4/2003 | Haga | ........... | G09G 3/3688 327/333 |
| 2005/0206432 A1 * | 9/2005 | Tobita | ........... | G09G 3/20 327/333 |
| 2008/0025066 A1 * | 1/2008 | Fasoli | ........... | G11C 8/14 365/148 |
| 2009/0027100 A1 * | 1/2009 | Choi | ........... | G09G 3/3266 327/333 |
| 2009/0278586 A1 * | 11/2009 | Chen | ........... | H03K 19/017545 327/333 |
| 2011/0074614 A1 | 3/2011 | Ogawa | | |
| 2013/0222036 A1 * | 8/2013 | Kwon | ........... | H03K 3/356113 327/333 |
| 2014/0240208 A1 * | 8/2014 | Kim | ........... | G09G 3/3696 345/87 |

FOREIGN PATENT DOCUMENTS

WO WO-2007/094571 A1 8/2007

* cited by examiner

*Primary Examiner* — Lincoln Donovan
*Assistant Examiner* — Khareem E Almo
(74) *Attorney, Agent, or Firm* — McDermott Will & Emery LLP

(57) ABSTRACT

A low-power level-shift circuit for data-dependent signals includes a buffer circuit, a coupling capacitor, and a biasing circuit. The buffer circuit is biased by a low-voltage domain voltage supply and configured to receive a data-dependent signal. The coupling capacitor is coupled, at a first node, to an output node of the buffer circuit. The biasing circuit is coupled to a second node of the coupling capacitor and a switch. The level-shift circuit can translate a voltage level of the received data-dependent signal to a high-voltage domain that is suitable for proper operation of the switch.

20 Claims, 5 Drawing Sheets

US 9,325,313 B2

LOW-POWER LEVEL-SHIFT CIRCUIT FOR DATA-DEPENDENT SIGNALS

CROSS-REFERENCE TO RELATED APPLICATIONS

This application claims the benefit of priority under 35 U.S.C. §119 from U.S. Provisional Patent Application 61/932,689 filed Jan. 28, 2014, which is incorporated herein by reference in its entirety.

TECHNICAL FIELD

The present description relates generally to broadband communications, and more particularly, but not exclusively, to a low-power level-shift circuit for data-dependent signals technical field.

BACKGROUND

High resolution digital-to-analog (DAC) circuits are commonly used in many communication circuits. For example, broadband and high-speed (e.g., 10 Gigabit) Ethernet communication circuits may use multi-GHz and high-resolution DAC circuits. Large-amplitude push-pull DAC circuits may include switches (e.g., PMOS switches) that can be driven from a high-voltage domain (e.g., 3.3V) supply voltage. The DAC circuits, however, have to be able to operate with low-voltage domain (e.g., 0.8V-1.2V) input digital signals that are data-dependent. Therefore, the input digital signal has to pass through a level-shift circuit that can convert the voltage level of the input digital signal from the low-voltage domain to the high-voltage domain, for the DAC circuit to function properly.

Existing level-shift circuits may suffer from a number of drawbacks, for example, level translators typically do not shift the "0" level of the signal (e.g., associated with a low-voltage supply), use a large chip area, or are power hungry. Shifting the "0" level of the signal is desired when the signal is being used as an input to a large-amplitude push-pull DAC circuit with thin-oxide PMOS switch. Additionally, some traditional level-shift circuits do not operate properly with data-dependent digital signals (e.g., return-to-zero signals) and are suitable for fixed duty cycle input signals (e.g., clock signals). The high-power consumption of the existing solutions may arise from driving the current through the DAC switch from a high voltage supply, or using power hungry on-chip low-dropout (LDO) regulators.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and can be practiced using one or more implementations. In one or more instances, well-known structures and components are shown in block diagram form in order to avoid obscuring the concepts of the subject technology.

The subject technology provides methods and implementations for proving a low-power level-shift circuit for data-dependent signals. The subject technology includes a number of advantageous features such as allowing level shifting of data-dependent signals, operating with significantly lower (e.g., by more than a factor of 3) power consumption, consuming less chip area, and no digital data edge rate degradation, which typically occurs in traditional solutions using LDO, due to finite output impedance of the LDO, or using low-speed level translators. The level-shift circuit of the subject technology may be used in a number of applications, for example, in Ethernet (e.g., 10-Gigabit Ethernet) switches, set-top-boxes (STBs), hand-held communication devices, and other applications that can benefit from a high-speed and high-resolution digital-to-analog converter (DAC) (e.g., a multi-GHz push-pull DAC such as a class-B push-pull DAC).

Figure 1A:
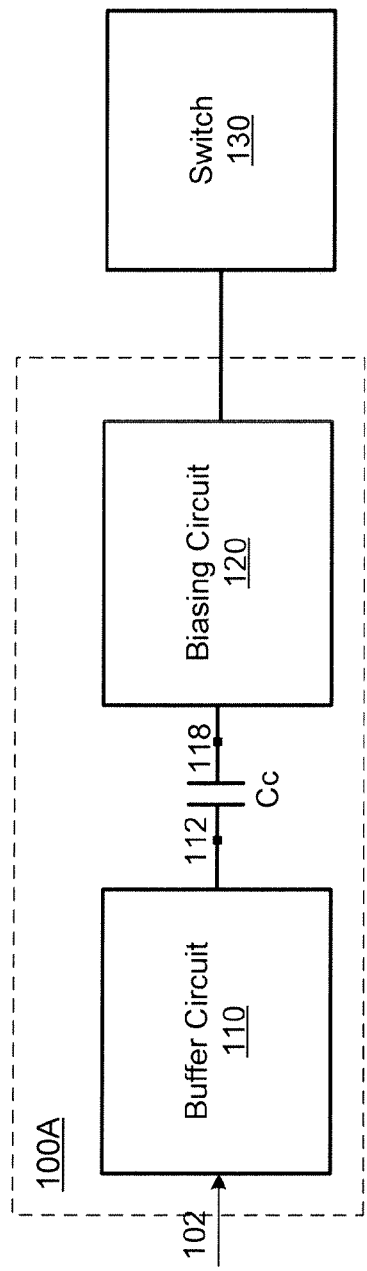
FIGS. 1A and 1B illustrate a high-level block diagram of an example of a level-shift circuit for data-dependent signals and a corresponding functional diagram in accordance with one or more implementations.
Figure 1B:
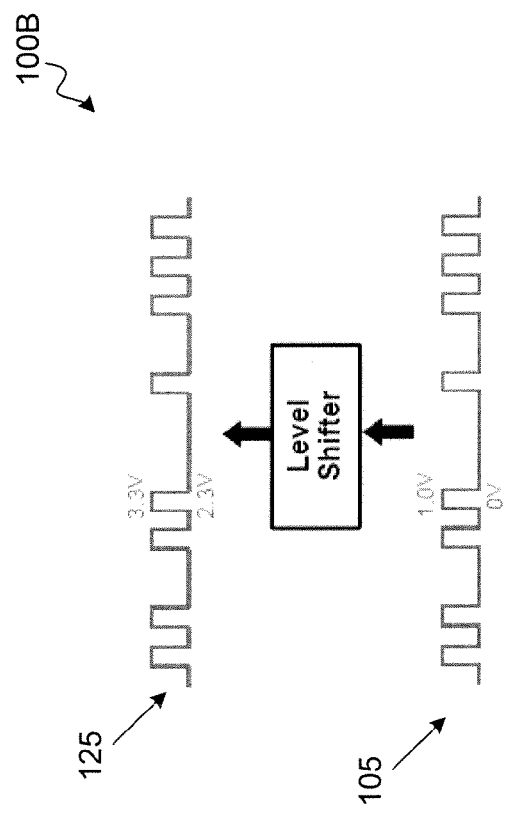

FIGS. 1A and 1B illustrate a high-level block diagram of an example of a level-shift circuit 100A for data-dependent signals and a corresponding functional diagram 100B in accordance with one or more implementations of the subject technology. The level-shift circuit 100A is a low power level shifter that includes a buffer circuit 110, a coupling capacitor Cc, and a biasing circuit 130, and is coupled to a switch. The buffer circuit 110 is biased by a low-voltage domain voltage supply and receives a data-dependent signal 102. The coupling capacitor Cc is coupled, at a first node 112, to an output node of the buffer circuit. The biasing circuit 120 is coupled to a second node 118 of the coupling capacitor Cc and a switch 130.

As shown by the functional diagram 100B, the level-shift circuit 100A can translate a voltage level of the received data-dependent signal 102 from a low-voltage domain (e.g., 1V domain such as ≤1.2V) to a high-voltage domain (e.g., a 3V domain such as 3-4V) that is suitable for proper operation of the switch 130. For example, a signal 105, which is an example of a 1V-domain signal and varies between 0V and 1V, can be translated by the level-shift circuit 100A to a signal 125, which is an example of a 3V-domain signal and varies, for instance, between 2.3 and 3.3V.

Figure 2A:
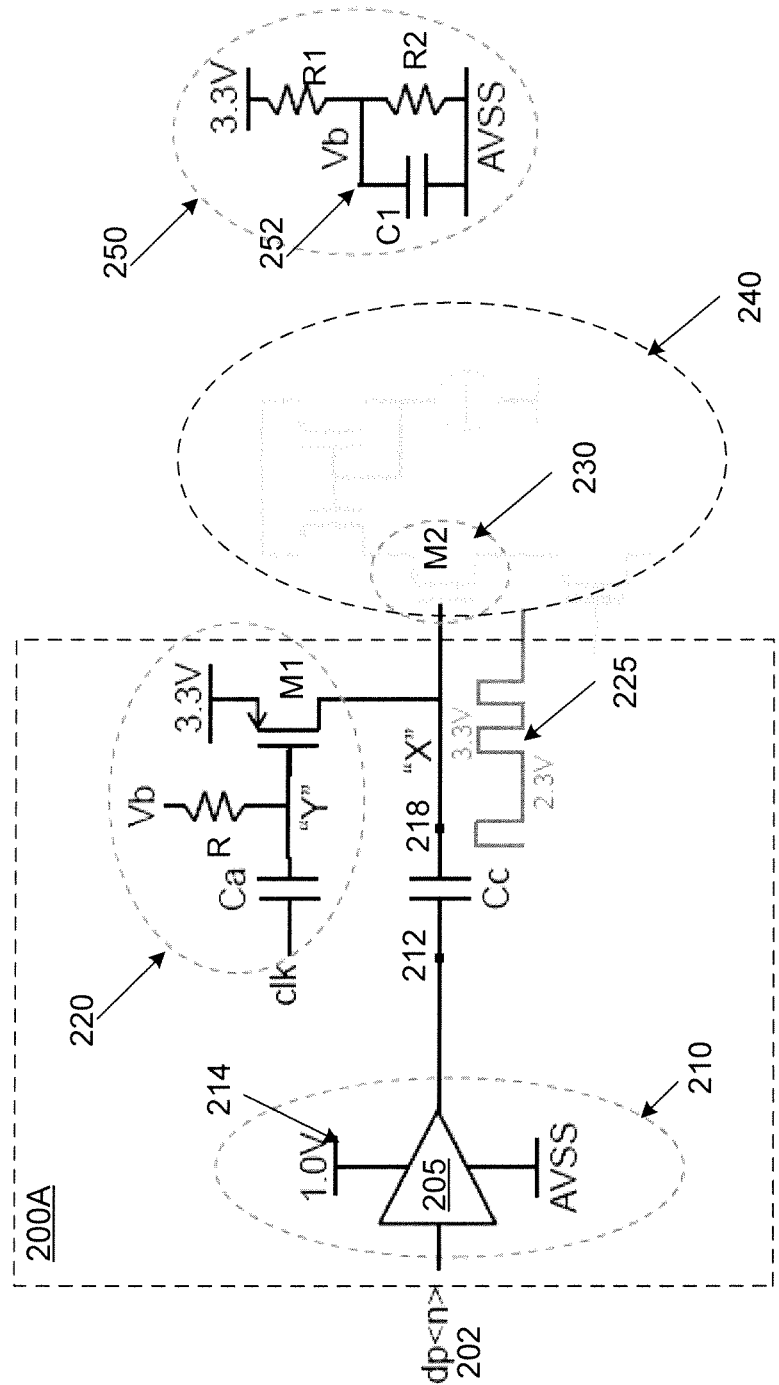
FIGS. 2A and 2B illustrate examples of implementations of a level-shift circuit for data-dependent signals in accordance with one or more implementations.
Figure 2B:
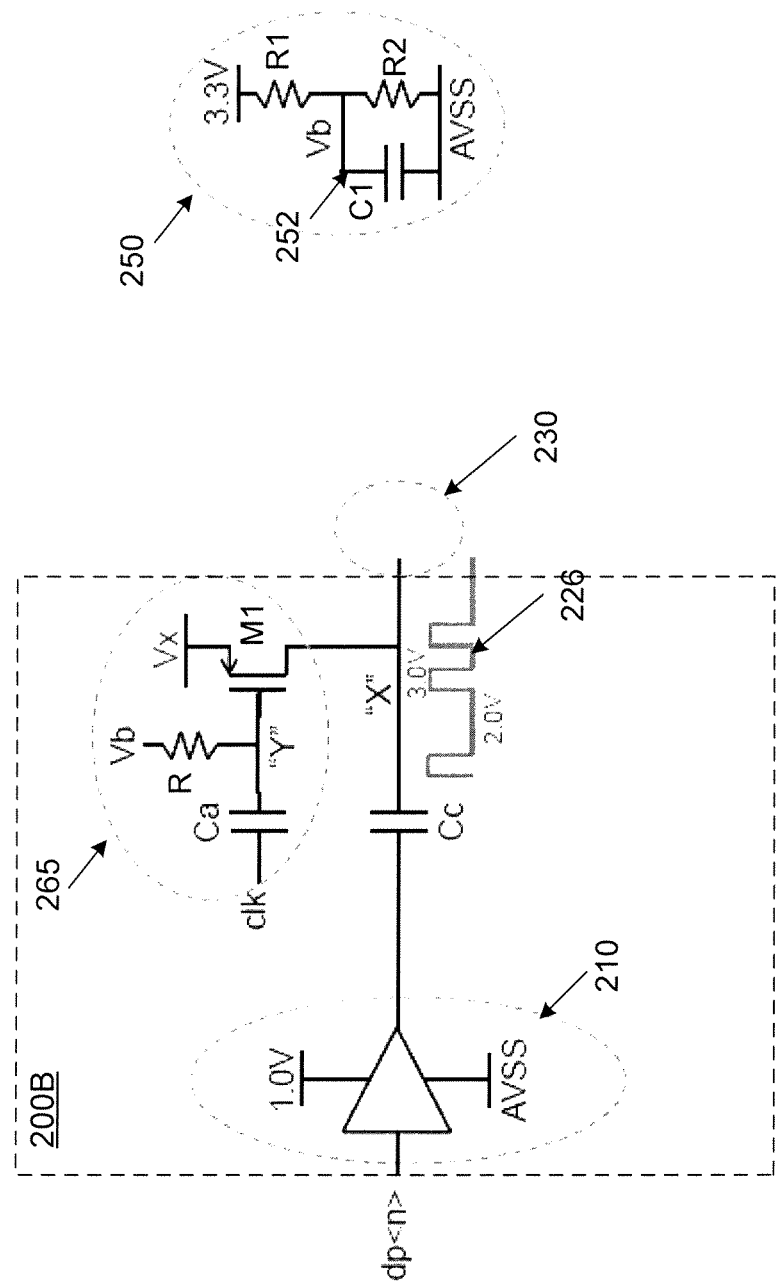

FIGS. 2A and 2B illustrate examples of implementations of a level-shift circuit for data-dependent signals in accordance with one or more implementations of the subject technology. An example implementation 200A of the level-shift circuit, shown in FIG. 2A includes a buffer circuit 210, a coupling capacitor Cc, and a biasing circuit 220 coupled to a switch 230. In one or more implementations, the buffer circuit 210 includes an amplifier (e.g., a high-input impedance amplifier, such as an inverter) 205 that is biased via a low-voltage domain voltage supply 214 (e.g., ≤1.2V) and a voltage supply AVSS (e.g., zero volt). The buffer circuit 210 is coupled to a first node 212 of the coupling capacitor Cc and can strengthen the input signal driving capability (e.g., driving current) to drive the load at node X (e.g., 218). The fact that this driving current is supplied by a low-domain voltage source 214 facilities low-power operation of the level-shift circuit (e.g., 200A).

In some implementations, the biasing circuit 220 includes a transistor M1 (e.g., a p-channel metal-oxide semiconductor (PMOS) transistor), a capacitor Ca, and a resistor R. A drain node of the transistor M1 is coupled to a second node 218 of the coupling capacitor Cc. A source node of the transistor M1 is coupled to a high domain supply voltage (e.g., 3.3V). The resistor R couples a gate node (e.g., node Y) of the transistor M1 to an output node 252 (e.g., at Vb) of a voltage divider circuit 250. The gate node of the transistor M1 is also coupled through a capacitor Ca to a clock signal (clk). In some aspects, the transistor M1 is a thin-oxide MOS transistor.

The level-shift circuit 200B is operable to translate an input signal 202 and generate, at a node X (e.g., node 218), a signal 225. In other words, the level-shift circuit 200B can translate the input signal 202, which is a return-to-zero low-voltage domain signal (e.g., 1V-domain signal), to the signal 225, which is a high-level domain (e.g., 3V-domain) signal. It is understood that the high-level domain signal 225 is the proper signal for correct operation of the switch 230 (e.g., a PMOS switch such as a thin oxide PMOS switch, biased with a high-voltage (e.g., between 3V and 4V, such as 3.3V) supply. The thin oxide PMOS switch has the advantage that it can be as fast as an NMOS switch. The thin oxide switch is, however, understood to be damaged with voltages over approximately 1V. Therefore, the signal 225 applied to the switch 230 (e.g., to the gate node of the transistor M2) make it possible for transistor M2 to be biased with a high-level domain supply voltage (e.g., 3.3V). The switch 230 can be a switch of a DAC circuit (e.g., a push-pull DAC cell) 240 that is used to enable a push-pull operation of current sources of the push-pull DAC circuit 240. In one or more aspects, the level-shift circuit 200B can generate the high-level domain signal 225 with fast rise/fall times and low power, and is a low area circuit.

The coupling capacitor Cc can block a DC portion of the input signal 202 and thus the average voltage amplitude of the input signal is approximately 0.5V. This voltage amplitude has to be increased by the biasing circuit 220 to approximately 2.8V (average of 2.3V and 3.3V), which amounts to an increase of approximately 2.3V. Therefore, the voltage Vb of the output node 252 of the voltage divider circuit 250 has to be 2.8V, which can be provided by proper selection of the resistance values of the resistors R1 and R2. The capacitor C1 is just a bypass capacitor that can bypass AC signals to ground.

In some aspects, a voltage variation at the node Y is caused by the clock signal elk, which is synchronized with a clock signal that is used to generate the input signal 202. The voltage level at node Y is applied to the gate node of the transistor M1. Therefore, transistor M1 is controlled by the clock signal elk. The transistor M1 can pull up the voltage at node X to approximately 3.3V, when the voltage at the node Y is low (e.g., approximately 2.3V). The lower level (e.g., approximately 2.3V) of the voltage at the node X occurs when the transistor M1 is off and is understood by the 1V swing of the voltage across the coupling capacitor Cc (e.g., due to the output signal of the amplifier 205, which has an amplitude of approximately 1V). In other words, the biasing circuit 220 provides a DC bias at the node X that tracks the DC bias of the input signal 202 and adds a level shift to the input signal.

The example implementation 200B shown in FIG. 2B, is similar to the example implementation 200A of FIG. 2B, except for a biasing circuit 265 that includes a variable voltage Vx coupled to the source of the transistor M1, instead of the fixed voltage (e.g., 3.3V) supply used in FIG. 2A. This can provide desired flexibility in output high voltage. For example, the output voltage 226 at node X can vary between 2V and 3V, for which the value of variable voltage Vx can be 3V. In other words, the switch 230 does not have to be turned off by a high voltage of 3.3V, and can be turned off by lower voltages (e.g., e.g., Vx such as 3V). This will allow a lower on-resistance (Ron) of the switch 230, as the on voltage at the gate of the switch 230 is lower (e.g., 2V, instead of 2.3V as in FIG. 2A). Since the DC current required at the node X is very small, the circuit requirement for generating the variable voltage Vx can be greatly relaxed.

Figure 3:
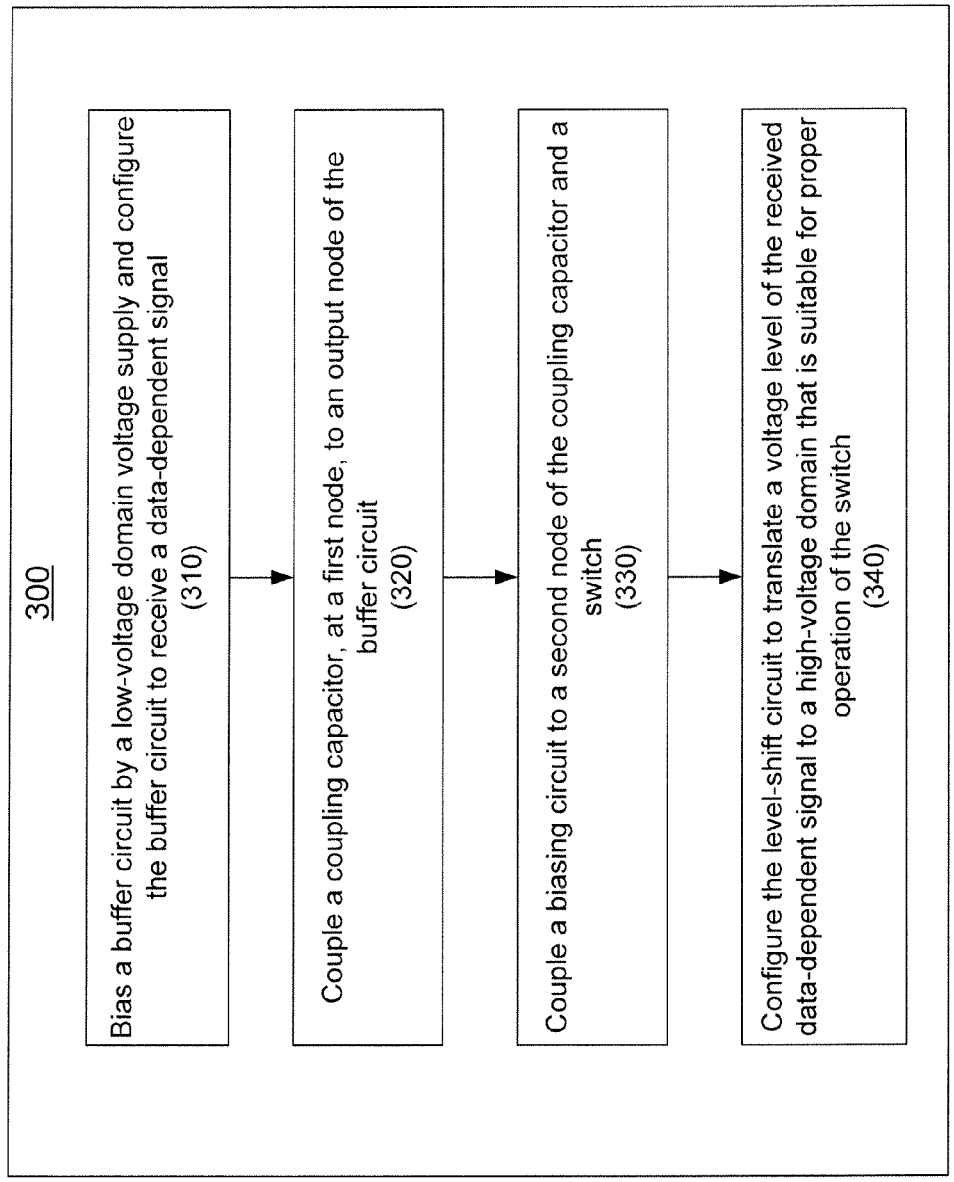
FIG. 3 illustrates an example of a method for providing a level-shift circuit for data-dependent signals in accordance with one or more implementations.

FIG. 3 illustrates an example of a method 300 for providing a level-shift circuit for data-dependent signals in accordance with one or more implementations of the subject technology. For explanatory purposes, the example method 300 is described herein with reference to, but is not limited to, the level-shift circuit 100A of FIG. 1A and 200A of FIG. 2A. Further for explanatory purposes, the blocks of the example method 300 are described herein as occurring in serial, or linearly. However, multiple blocks of the example method 300 can occur in parallel. In addition, the blocks of the example method 300 need not be performed in the order shown and/or one or more of the blocks of the example method 300 need not be performed.

In one or more implementations, a buffer circuit (e.g., 110 of FIG. 1A or 210 of FIG. 2A) is biased by a low-voltage domain voltage supply (e.g., 214 of FIG. 2A) and is configured to receive a data-dependent signal (e.g., 102 of FIG. 1A or 202 of FIG. 2A) (310). A coupling capacitor (e.g., Cc of FIG. 1A or FIG. 2A) is coupled, at a first node (e.g., 112 of FIG. 1A or 212 of FIG. 2A), to an output node of the buffer circuit (320). A biasing circuit (e.g., 120 of FIG. 1A or 220 of FIG. 2A) is coupled to a second node (e.g., 118 of FIG. 1A or 218 of FIG. 2A) of the coupling capacitor and to a switch (e.g., 130 of FIG. 1A or 230 of FIG. 2A) (330). The level-shift circuit is configured to translate a voltage level of the received data-dependent signal to a high-voltage domain (e.g., as shown in 225 of FIG. 2A or 226 of FIG. 2B) that is suitable for proper operation of the switch (340).

Figure 4:
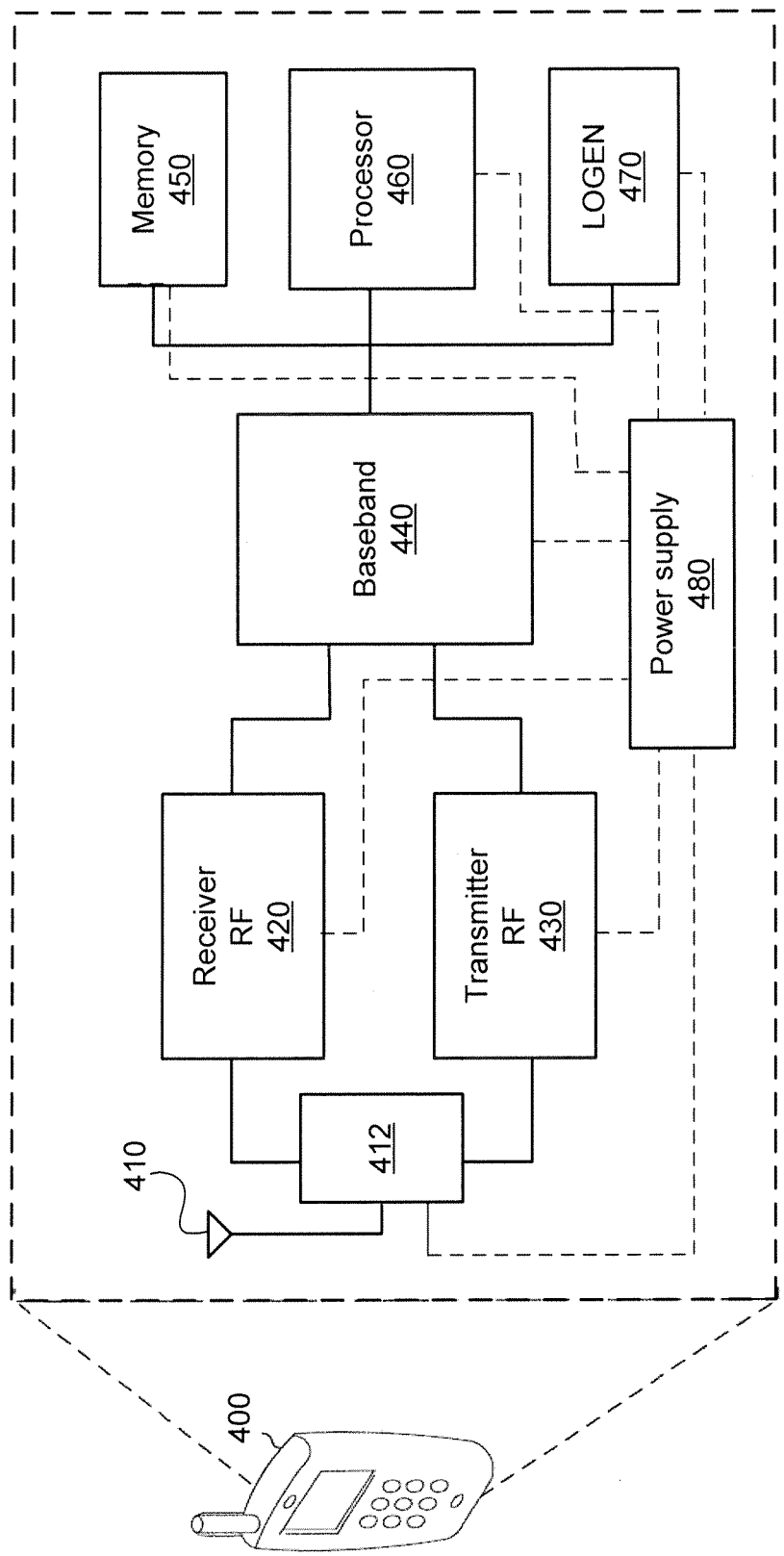
FIG. 4 illustrates an example of a wireless communication device in accordance with one or more implementations.

FIG. 4 illustrates an example of a wireless communication device 400 in accordance with one or more implementations of the subject technology. The wireless communication device 400 can comprise a radio-frequency (RF) antenna 410, a receiver 420, a transmitter 430, a baseband processing module 440, a memory 450, a processor 460, a local oscillator generator (LOGEN) 470, and a power supply 480. In various embodiments of the subject technology, one or more of the blocks represented in FIG. 4 can be integrated on one or more semiconductor substrates. For example, the blocks 420-470 can be realized in a single chip or a single system on chip, or can be realized in a multi-chip chipset.

The RF antenna 410 can be suitable for transmitting and/or receiving RF signals (e.g., wireless signals) over a wide range of frequencies. Although a single RF antenna 410 is illustrated, the subject technology is not so limited.

The receiver 420 comprises suitable logic circuitry and/or code that can be operable to receive and process signals from the RF antenna 410. The receiver 420 may, for example, be operable to amplify and/or down-covert received wireless signals. In various embodiments of the subject technology, the receiver 420 is operable to cancel noise in received signals and can be linear over a wide range of frequencies. In this manner, the receiver 420 is suitable for receiving signals in accordance with a variety of wireless standards. Wi-Fi, WiMAX, Bluetooth, and various cellular standards.

The transmitter 430 comprises suitable logic circuitry and/or code that can be operable to process and transmit signals from the RF antenna 410. The transmitter 430 may, for example, be operable to up-covert baseband signals to RF signals and amplify RF signals. In various embodiments of the subject technology, the transmitter 430 is operable to up-convert and amplify baseband signals processed in accordance with a variety of wireless standards. Examples of such standards include Wi-Fi, WiMAX, Bluetooth, and various cellular standards. In various embodiments of the subject technology, the transmitter 430 is operable to provide signals for further amplification by one or more power amplifiers.

In one or more implementations, the transmitter 430 may include a DAC circuit that can convert the digital signals (e.g., data-dependent signals) received from the baseband 440 and covert the received digital signals to analog signals. The DAC circuit may include a DAC switch (e.g., 130 of FIG. 1A or 230 of FIG. 2A) that has to be driven by the data-dependent signals. The DAC switch can be a thin oxide MOS transistor that is biased by a high-level mode supply voltage (e.g. between 3V-4V, such as 3.3V). Therefore the data-dependent signal that drives the DAC switch has to be a high voltage domain signal. The low-power level-shift circuit (e.g. 120 of FIG. 1A or 220 of FIG. 2A) of the subject technology can be applied to convert the low voltage domain (e.g., 1V) input digital signals (e.g., data-dependent signals) to the proper high voltage domain signals for the DAC switch. The low-power level-shift circuit of the subject technology includes a number of advantageous features such operating with significantly lower (e.g., by more than a factor of 3) power consumption, consuming less chip area, and no digital data edge rate degradation, which typically occurs in traditional solutions using LDO, due to finite output impedance of the LDO, or using low-speed level translators.

The duplexer 412 provides isolation in the transmit band to avoid saturation of the receiver 420 or damaging parts of the receiver 420, and to relax one or more design requirements of the receiver 420. Furthermore, the duplexer 412 can attenuate the noise in the receive band. The duplexer is operable in multiple frequency bands of various wireless standards.

The baseband processing module 440 comprises suitable logic, circuitry, interfaces, and/or code that can be operable to perform processing of baseband signals. The baseband processing module 440 may, for example, analyze received signals and generate control and/or feedback signals for configuring various components of the wireless communication device 400 such as the receiver 420. The baseband processing module 440 is operable to encode, decode, transcode, modulate, demodulate, encrypt, decrypt, scramble, descramble, and/or otherwise process data in accordance with one or more wireless standards.

The processor 460 comprises suitable logic, circuitry, and/or code that can enable processing data and/or controlling operations of the wireless communication device 400. In this regard, the processor 460 is enabled to provide control signals to various other portions of the wireless communication device 400. The processor 460 can also control transfers of data between various portions of the wireless communication device 400. Additionally, the processor 460 can enable implementation of an operating system or otherwise execute code to manage operations of the wireless communication device 400.

The memory 450 comprises suitable logic, circuitry, and/or code that can enable storage of various types of information such as received data, generated data, code, and/or configuration information. The memory 450 comprises, for example, RAM (e.g. SRAM), ROM, flash, and/or magnetic storage. In various embodiment of the subject technology, Information stored in the memory 450 can be utilized for configuring the receiver 420 and/or the baseband processing module 440.

The local oscillator generator (LOG EN) 470 comprises suitable logic, circuitry, interfaces, and/or code that can be operable to generate one or more oscillating signals of one or more frequencies. The LOGEN 470 can be operable to generate digital and/or analog signals. In this manner, the LOGEN 470 can be operable to generate one or more clock signals and/or sinusoidal signals. Characteristics of the oscillating signals such as the frequency and duty cycle can be determined based on one or more control signals from, for example, the processor 460 and/or the baseband processing module 440.

In operation, the processor 460 can configure the various components of the wireless communication device 400 based on a wireless standard according to which it is desired to receive signals. Wireless signals can be received via the RF antenna 410 and amplified and down-converted by the receiver 420. The baseband processing module 440 can perform noise estimation and/or noise cancellation, decoding, and/or demodulation of the baseband signals. In this manner, information in the received signal can be recovered and utilized appropriately. For example, the information can be audio and/or video to be presented to a user of the wireless communication device, data to be stored to the memory 450, and/or information affecting and/or enabling operation of the wireless communication device 400. The baseband processing module 440 can modulate, encode and perform other processing on audio, video, and/or control signals to be transmitted by the transmitter 430 in accordance to various wireless standards. The power supply 480 can provide one or more regulated rail voltages (e.g., $V_{DD}$) for various circuitries of the wireless communication device 400.

Those of skill in the art would appreciate that the various illustrative blocks, modules, elements, components, and methods described herein can be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans can implement the described functionality in varying ways for each particular application. Various components and blocks can be arranged differently (e.g., arranged in a different order, or partitioned in a different way) all without departing from the scope of the subject technology.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

A phrase such as "an aspect" does not imply that such aspect is essential to the subject technology or that such aspect applies to all configurations of the subject technology. A disclosure relating to an aspect can apply to all configurations, or one or more configurations. An aspect can provide one or more examples of the disclosure. A phrase such as an "aspect" refers to one or more aspects and vice versa. A phrase such as an "embodiment" does not imply that such embodiment is essential to the subject technology or that such embodiment applies to all configurations of the subject technology. A disclosure relating to an embodiment can apply to all embodiments, or one or more embodiments. An embodiment can provide one or more examples of the disclosure. A phrase such an "embodiment" can refer to one or more embodiments and vice versa. A phrase such as a "configuration" does not imply that such configuration is essential to the subject technology or that such configuration applies to all configurations of the subject technology. A disclosure relating to a configuration can apply to all configurations, or one or more configurations. A configuration can provide one or more examples of the disclosure. A phrase such as a "configuration" can refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein can be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A low-power level-shift circuit for data-dependent signals, the circuit comprising:
    a buffer circuit biased by a low-voltage domain voltage supply and configured to receive a data-dependent signal;
    a coupling capacitor coupled, at a first node, to an output node of the buffer circuit; and
    a biasing circuit coupled to a second node of the coupling capacitor that is directly coupled to a switch,
    wherein the level-shift circuit is configured to translate a voltage level of the received data-dependent signal to a high-voltage domain that is suitable for proper operation of the switch.

2. The circuit of claim 1, wherein the switch comprises a DAC switch, wherein the DAC switch comprises a PMOS switch, wherein the level-shift circuit is configured to allow use of thin-oxide PMOS switch for the DAC switch, and wherein the DAC switch is biased using a high-voltage domain supply voltage.

3. The circuit of claim 1, wherein the data-dependent signal comprises a digital signal, wherein the digital signal comprises a low-voltage domain return-to-zero signal, and wherein the low-voltage domain comprises a voltage range approximately between 0.8 and 1.2 volt.

4. The circuit of claim 3, wherein the biasing circuit is controlled by a clock signal that is synchronized with the data-dependent signal.

5. The circuit of claim 1, wherein the biasing circuit is configured to provide a voltage level at the second node of the coupling capacitor, and wherein the voltage level is controlled by a clock signal, and wherein the voltage level tracks an average voltage level of the data-dependent signal.

6. The circuit of claim 1, wherein the high-voltage domain comprises a voltage range approximately between two and six volts.

7. The circuit of claim 1, wherein the biasing circuit comprises a voltage divider coupled to a PMOS transistor and a small coupling capacitor, and wherein the PMOS transistor is a fast thin-oxide PMOS transistor.

8. The circuit of claim 7, wherein the PMOS transistor provides a high voltage at the second node of the coupling capacitor when the data-dependent signal is one.

9. A method for providing a low-power level-shift circuit for data-dependent signals, the method comprising:
    configuring a buffer circuit to be biased by a low-voltage domain voltage supply and configuring the buffer circuit to receive a data-dependent signal;
    coupling a coupling capacitor, at a first node, to an output node of the buffer circuit;
    coupling a biasing circuit to a second node of the coupling capacitor that is directly coupled to a switch; and
    configuring the level-shift circuit to translate a voltage level of the received data-dependent signal to a high-voltage domain that is suitable for proper operation of the switch.

10. The method of claim 9, wherein the switch comprises a DAC switch, wherein the DAC switch comprises a PMOS switch.

11. The method of claim 10, further comprising configuring the level-shift circuit to allow use of a thin-oxide PMOS switch for the DAC switch, and wherein the DAC switch is biased by using a high-voltage domain supply voltage.

12. The method of claim 9, further comprising controlling the biasing circuit by a clock signal that is synchronized with the data-dependent signal.

13. The method of claim 9, further comprising configuring the biasing circuit to provide a voltage level at the second node of the coupling capacitor; and controlling the voltage level by a clock signal.

14. The method of claim 13, further comprising configuring the biasing circuit to provide the voltage level that tracks an average voltage level of the data-dependent signal.

15. The method of claim 9, wherein the biasing circuit comprises a voltage divider coupled to a PMOS transistor and a small coupling capacitor, and wherein the PMOS transistor is a fast thin-oxide PMOS transistor.

16. The method of claim 15, wherein the PMOS transistor provides a high voltage at the second node of the coupling capacitor when the data-dependent signal is one.

17. A communication device, comprising:
- a digital-to-analog converter (DAC) circuit configured to convert an analog signal to a digital signal, the DAC circuit including a switch;
- a level-shift circuit configured to translate a voltage level of a data-dependent signal to a high-voltage domain that is suitable for proper operation of the switch, the level-shift circuit comprising:
  - a buffer circuit biased by a low-voltage domain voltage supply and configured to receive the data-dependent signal;
  - a coupling capacitor coupled, at a first node, to an output node of the buffer circuit; and
  - a biasing circuit coupled to a second node of the coupling capacitor that is directly coupled to the switch.

18. The communication device of claim 17, wherein the switch comprises a DAC switch, wherein the DAC switch comprises a PMOS switch, wherein the level-shift circuit is configured to allow use of thin-oxide PMOS switch for the DAC switch, and wherein the DAC switch is biased using a high-voltage domain supply voltage.

19. The communication device of claim 17, wherein the data-dependent signal comprises a digital signal, wherein the digital signal comprises a low-voltage domain return-to-zero signal, and wherein the low-voltage domain comprises a voltage range approximately between 0.8 and 1.2 volt.

20. The communication device of claim 17, wherein:
- the biasing circuit is controlled by a clock signal that is synchronized with the data-dependent signal,
- the biasing circuit is configured to provide a voltage level at the second node of the coupling capacitor,
- the voltage level is controlled by a clock signal,
- the voltage level tracks an average voltage level of the data-dependent signal,
- the biasing circuit comprises a voltage divider coupled to a PMOS transistor and a small coupling capacitor,
- the PMOS transistor is a fast thin-oxide PMOS transistor, and
- the PMOS transistor provides a high voltage at the second node of the coupling capacitor when the data-dependent signal is one.

* * * * *